(12) United States Patent
Han et al.

(10) Patent No.: US 10,389,183 B2
(45) Date of Patent: Aug. 20, 2019

(54) MULTI-MODE WIRELESS POWER RECEIVING DEVICE AND METHOD

(71) Applicant: Center for Integrated Smart Sensors Foundation, Daejeon (KR)

(72) Inventors: Minseok Han, Gyeonggi (KR); Chongmin Kyung, Daejeon (KR)

(73) Assignee: CENTER FOR INTEGRATED SMART SENSORS FOUNDATION, Daejeon (KR)

( * ) Notice: Subject to any disclaimer, the term of this patent is extended or adjusted under 35 U.S.C. 154(b) by 243 days.

(21) Appl. No.: 15/537,365

(22) PCT Filed: Dec. 18, 2014

(86) PCT No.: PCT/KR2014/012509
§ 371 (c)(1),
(2) Date: Jun. 16, 2017

(87) PCT Pub. No.: WO2016/098927
PCT Pub. Date: Jun. 23, 2016

(65) Prior Publication Data
US 2017/0353055 A1 Dec. 7, 2017

(51) Int. Cl.
*H02J 50/12* (2016.01)
*H01Q 1/24* (2006.01)
(Continued)

(52) U.S. Cl.
CPC ............ *H02J 50/12* (2016.02); *H01Q 1/248* (2013.01); *H01Q 7/00* (2013.01); *H02J 7/025* (2013.01);
(Continued)

(58) Field of Classification Search
CPC .. H02J 50/12; H02J 50/80; H02J 50/20; H02J 7/025; H01Q 1/248; H01Q 7/00; H03H 11/28; H04B 5/0037; H04B 5/0093
See application file for complete search history.

(56) References Cited

U.S. PATENT DOCUMENTS

2010/0190436 A1   7/2010  Cook et al.
2012/0149301 A1*  6/2012  Wiley ................. H04B 5/0031
                                                   455/41.1
(Continued)

FOREIGN PATENT DOCUMENTS

KR   10-2013-0106527 A   9/2013
KR   10-2014-0131428 A   11/2014

OTHER PUBLICATIONS

International Search Report dated Sep. 14, 2015, issued in corresponding International Application No. PCT/KR2014/012509, filed Dec. 18, 2014, 2 pages.

*Primary Examiner* — Carlos Amaya
(74) *Attorney, Agent, or Firm* — Christensen O'Connor Johnson Kindness PLLC (57) ABSTRACT

A multi-mode wireless power receiving device and method are disclosed. The multi-mode wireless power receiving device can comprise: an antenna module comprising an outer loop and an inner loop; a mode control unit for controlling an operation mode of the antenna module; a switch connecting the outer loop and the inner loop, and operated by the mode control unit; an outer loop module for supporting a magnetic resonance method and NFC communication by using the outer loop, according to the operation of the switch; and an inner loop module using the outer loop and the inner loop simultaneously so as to support a magnetic induction method according to the operation of the switch, thereby transmitting power.

16 Claims, 5 Drawing Sheets

(51) Int. Cl.
*H01Q 7/00* (2006.01)
*H02J 7/02* (2016.01)
*H03H 11/28* (2006.01)
*H04B 5/00* (2006.01)
*H02J 50/20* (2016.01)
*H02J 50/80* (2016.01)

(52) U.S. Cl.
CPC .............. *H02J 50/20* (2016.02); *H02J 50/80* (2016.02); *H03H 11/28* (2013.01); *H04B 5/0037* (2013.01); *H04B 5/0093* (2013.01)

(56) References Cited

U.S. PATENT DOCUMENTS

2014/0117869 A1 5/2014 Lee et al.
2014/0141715 A1 5/2014 Smith

\* cited by examiner

MULTI-MODE WIRELESS POWER RECEIVING DEVICE AND METHOD

TECHNICAL FIELD

The present invention relates to a multi-mode wireless power receiving device and a method thereof, and more particularly, to a multi-mode wireless power receiving device for supporting magnetic induction, magnetic resonance, and near field communication (NFC) communication, and a method thereof.

BACKGROUND ART

A mobile terminal such as a mobile phone, a personal digital assistant (PDA), or the like is powered by a rechargeable battery, and a battery of the mobile terminal is charged by using a separate charging device. In general, separate contact terminals are placed outside each of the charging device and the battery, and the charging device is electrically connected with the battery by electrically connecting the separate contact terminals with each other.

Recently, a wireless charging technology or a non-contact charging technology have been developed and have been used for a large number of electronic devices. A wireless power transmission technology that is currently commercialized or is being studied may be roughly divided into four types.

One of them is a high power microwave radiation method. This method may be used for long-range transmission because it is possible to transmit high power by using a frequency of a few GHz. However, the one has not been commercialized due to harmfulness to human body, straightness, and the like. Another of them is a radiative short-range transmission method of a radiative manner. This refers to a radio-frequency identification (RFID) service using a RFID/USN frequency band of an ultra-high frequency (UHF) or an ISM band of 2.4 GHz. This is currently commercialized in a specific field such as a distribution field, a logistics field, or the like. This may only transmit power of maximum dozens milliwatts due to radiation loss. In addition, an extension of a RFID standard is exemplified as an ultra-short range wireless communication technology such as NFC.

Meanwhile, a contact-type transmission method using inductive coupling refers to a method for transmitting electric power of a few watts in a contact manner at a spaced distance of a few millimeters to a few centimeters, and uses a frequency of 125 kHz, 135 kHz, or the like. Now, the method may be applied to a traffic card, a wireless shaver, an electric toothbrush, and the like.

In addition, the nonradiated magnetic resonance method is based on a resonant coupling method. Resonant coupling refers to a phenomenon in which an electromagnetic wave propagates from one medium to another medium through a short-range magnetic field when the two media resonate at the same frequency in the case of magnetic resonance. The method may transmit power of dozens watts within a spaced distance of a few meters. However, to implement the method, it is necessary to keep a value of a quality factor (Q) of the resonator high.

In the meantime, a large number of mobile terminals equipped with an NFC module for NFC communication have been recently released.

NFC is a proximity communication technology for transmitting and receiving data at a distance of about 10 cm using a frequency of 13.56 MHz. The NFC module mounted in the mobile terminal is used in various fields such as user authentication, an identifier (ID) card, a credit card, a mobile ticket, a mobile coupon, and the like. An NFC antenna is required for the NFC communication. The NFC antenna includes each of an NFC reader antenna and an NFC tag antenna. In the case where the NFC antenna is actually implemented on the mobile terminal, an integrated dual antenna structure in which the NFC reader antenna and the NFC tag antenna are stacked is generally used.

Korean patent publication No. 10-2013-0053856 relates to the wireless power receiver and a control method thereof and discloses a technology associated with a wireless power receiver that wirelessly receives power based on an electromagnetic resonance method and a control method thereof.

However, nowadays, a method for supporting all of magnetic induction, magnetic resonance, and NFC using one resonance coil is required.

DETAILED DESCRIPTION OF THE INVENTION

Technical Problem

An embodiment of the present invention may provide a multi-mode wireless power receiving device and a multi-mode wireless power receiving method that support magnetic induction, magnetic resonance, and NFC by using one resonance coil.

According to an embodiment the present invention, an antenna module of a dual loop type includes an outer loop and an inner loop each of which has a dual resonant frequency. A multi-mode wireless power receiving device and a method thereof that operate in the outer loop (magnetic resonance/NFC) mode and the inner loop (WPC/PMA of magnetic induction) mode through manipulation of the switch may be provided.

Technical Solution

A multi-mode wireless power receiving device includes an antenna module including an outer loop and an inner loop, a mode control unit that controls an operating mode of the antenna module, a switch connecting the outer loop and the inner loop and operated by the mode control unit, an outer loop module that supports a magnetic resonance method and near field communication (NFC) communication by using the outer loop, according to an operation of the switch, and an inner loop module that supports a magnetic induction method by using the outer loop and the inner loop simultaneously according to the operation of the switch and to transmit power.

The outer loop module selectively performs the magnetic resonance method and the NFC communication by using the outer loop if the switch is turned off.

The inner loop module selectively performs Power Matters Alliance (PMA) and Wireless Power Consortium (WPC) of the magnetic induction method by using the outer loop and the inner loop simultaneously to transmit the power, if the switch is turned on.

Each of the outer loop module and the inner loop module has a dual operating frequency.

The inner loop module includes a rectifier unit that rectifies a radio frequency (RF) signal input through the antenna module, a voltage control unit that changes a direct current (DC) signal rectified by the rectifier unit into a voltage capable of being used for a load device, and an impedance matching unit that is placed between the antenna module and the rectifier unit and matches impedance between the antenna module and the rectifier unit.

The impedance matching unit includes a PMA impedance matching unit and a WPC impedance matching unit that use the magnetic induction method.

The outer loop module further includes a magnetic resonance impedance matching unit using the magnetic resonance method. If the magnetic resonance impedance matching unit is selected, the rectifier unit of the inner loop module rectifies the RF signal input through the antenna module, the voltage control unit changes the rectified DC signal into the voltage capable of being used for the load device, and the inner loop module transmits the power.

The inner loop module further includes a charging unit that charges the load device by using the power being output.

The outer loop module further includes an NFC transceiver that performs the NFC communication to communicate with an external host, an NFC control unit that is connected with the NFC transceiver and controls an operation, an interface unit that communicates with the external host, and an NFC impedance matching unit that is placed between the NFC transceiver and the antenna module and matches impedance between the NFC transceiver and the outer loop of the antenna module.

The inner loop module further includes a charging state sensing unit that senses an operation of a charging unit, a wireless charging control unit that controls charging by using charging state information received from the charging state sensing unit, and a communication unit that receives a control message from an outside and transmits the control message to the wireless charging control unit.

The communication unit selects at least one of in-band and out-of-band. If the in-band is selected, the switch is turned on, and at least one or more of a PMA impedance matching unit and a WPC impedance matching unit is selected by the mode control unit. If the out-of-band is selected, the switch is turned off, and a magnetic resonance impedance matching unit is selected by the mode control unit.

A multi-mode wireless power receiving method includes receiving at least one of wireless power and a communication signal, which have the same operating frequency, from a wireless power transmitting device, controlling an operating mode of an antenna module by manipulating, at a mode control unit, a switch, supporting transmission of the wireless power and NFC communication of a magnetic resonance method by using an outer loop of the antenna module, if the switch is turned off, and transmitting the wireless power to a wireless power receiving device by connecting the outer loop and an inner loop such that PMA and WPC of a magnetic induction method are supported, if the switch is turned on.

The transmitting of the wireless power to the wireless power receiving device by connecting the outer loop and the inner loop and by supporting PMA and WPC of the magnetic induction method includes matching, by at least one or more of a PMA impedance matching unit and a WPC impedance matching unit that use the magnetic induction method, impedance between the antenna module and a rectifier unit, rectifying a RF signal input through the antenna module, and changing a rectified DC signal into a voltage capable of being used for a load device to transmit the wireless power.

The method further includes selecting, by a communication unit, at least one of in-band and out-of-band, if the in-band is selected, transmitting the wireless power by turning on the switch such that the mode control unit selects at least one or more of a PMA impedance matching unit and a WPC impedance matching unit, and if the out-of-band is selected, transmitting the wireless power by turning off the switch such that the mode control unit selects a magnetic resonance impedance matching unit.

The supporting of the transmission of the wireless power and the NFC communication of the magnetic resonance method by using the outer loop of the antenna module includes, if a magnetic resonance impedance matching unit is selected, rectifying an RF signal input through the antenna module, changing a rectified DC signal into a voltage capable of being used for a load device, and transmitting the wireless power.

The supporting of the transmission of the wireless power and the NFC communication of the magnetic resonance method by using the outer loop of the antenna module includes matching impedance between a NFC transceiver and the outer loop of the antenna module and performing the NFC communication through an interface such that the NFC transceiver communicates with an external host.

Other aspects, advantages, and salient features of the disclosure will become apparent to those skilled in the art from the following detailed description, which, taken in conjunction with the annexed drawings, discloses various embodiments of the present disclosure.

Advantageous Effects of the Invention

According to an embodiment of the present invention, magnetic induction, magnetic resonance, and NFC may be supported by using one resonance coil, and thus, a multi-mode wireless power receiving device and method capable of being wirelessly charged in a multi-mode may be provided.

According to an embodiment of the present invention, an antenna module of a dual loop type may include an outer loop and an inner loop each of which has a dual resonant frequency, and thus a multi-mode wireless power receiving device and a method thereof that operate in the outer loop (magnetic resonance/NFC) mode and the inner loop (WPC/PMA of magnetic induction) mode through manipulation of the switch may be provided.

BEST MODE

Hereinafter, embodiments of the present invention will be described in detail with reference to the accompanying drawings.

Figure 1:
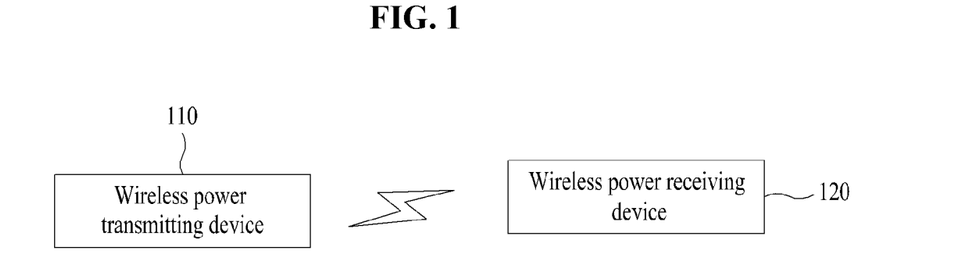
FIG. 1 is a block diagram for describing transmission/reception of wireless power and a communication signal of a wireless power receiving device and a wireless power transmitting device, according to an embodiment of the present invention.

FIG. 1 is a block diagram for describing transmission/reception of wireless power and a communication signal of a wireless power receiving device and a wireless power transmitting device, according to an embodiment of the present invention.

Referring to FIG. 1, a wireless power receiving device 120 may receive at least one of the wireless power and the communication signal from a wireless power transmitting device 110.

For example, the wireless power transmitting device 110 may perform a predetermined authentication procedure and may supply the wireless power to the authenticated wireless power receiving device 120. The wireless power transmitting device 110 may supply the wireless power based on a resonance manner, and thus the wireless power transmitting device 110 may transmit an electromagnetic wave for resonance having a preset frequency. In addition, the wireless power transmitting device 110 may supply the wireless power to a plurality of wireless power receiving devices 120.

The wireless power receiving device 120 may receive the wireless power from the wireless power transmitting device 110 to charge a battery included therein. Hereinafter, the wireless power receiving device 120 may be a device that is capable of processing or transmitting and receiving a predetermined communication packet and may be implemented with, for example, a mobile terminal, or the like.

In this case, the mobile terminal may include a mobile phone, a smartphone, a laptop computer, a digital broadcasting terminal, a personal digital assistant (PDA), a portable multimedia player (PMP), a navigation device, or the like.

Figure 2:
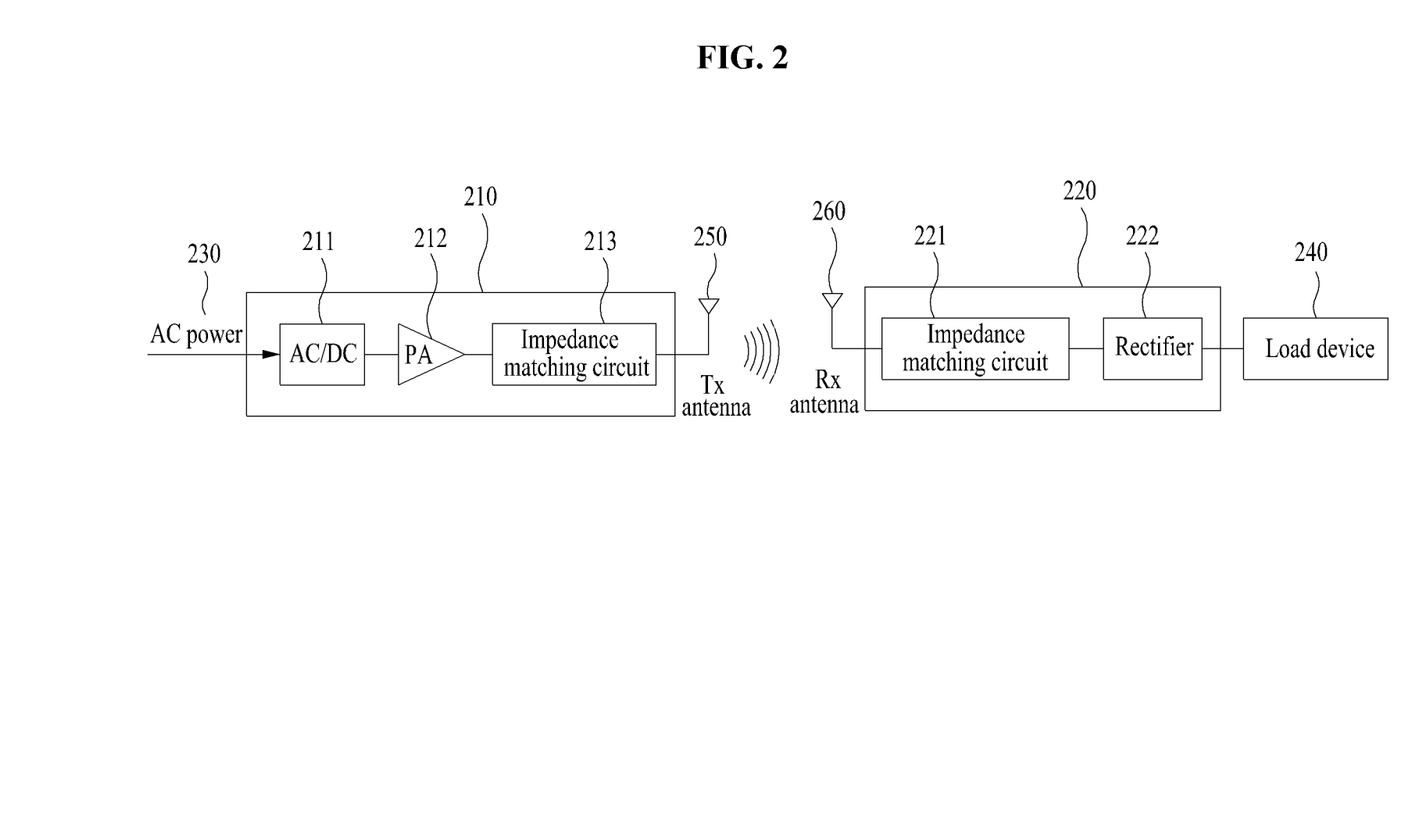
FIG. 2 is a block diagram for describing a wireless power transmitting device using magnetic resonance, according to an embodiment of the present invention.

FIG. 2 is a block diagram for describing a wireless power transmitting device using magnetic resonance, according to an embodiment of the present invention.

Referring to FIG. 2, the wireless power transmitting device may transmit power between a wireless power transmitting device 210 and a wireless power receiving device 220 in a non-contact magnetic resonance manner.

To transmit energy, the wireless power transmitting device 210 may irradiate an electromagnetic field to the outside by using a transmit antenna unit 250. In addition, the wireless power transmitting device 210 may receive necessary driving power and power for irradiating the electromagnetic field through an input power supply 230.

After changing AC power input from the input power supply 230 into an electromagnetic wave signal by using an AC/DC converter 211, a power amplifier 212, an impedance matching circuit 213, and the like, the wireless power transmitting device 210 may transmit power to the wireless power receiving device 220 through the transmit antenna unit 250.

The wireless power receiving device 220 may receive the electromagnetic wave signal from the wireless power transmitting device 210. To the end, the wireless power receiving device 220 may include a receive antenna unit 260. In the case, it is preferable that a resonant frequency of the receive antenna unit 260 may be the same as or close to a resonant frequency of the transmit antenna unit 250. In this case, an energy transfer channel may be formed by resonant coupling between the transmit antenna unit 250 and the receive antenna unit 260.

The electromagnetic wave irradiated from the transmit antenna unit 250 may be transmitted to the receive antenna unit 260 through the energy transfer channel. The electromagnetic wave input through the receive antenna unit 260 may be changed into power through an impedance matching circuit 221 and a rectifier 222, and the like in the wireless power receiving device 220. The changed power may be transmitted to a load device 240 connected with the wireless power receiving device 220 to charge the load device 240 or to provide the driving power.

Figure 3:
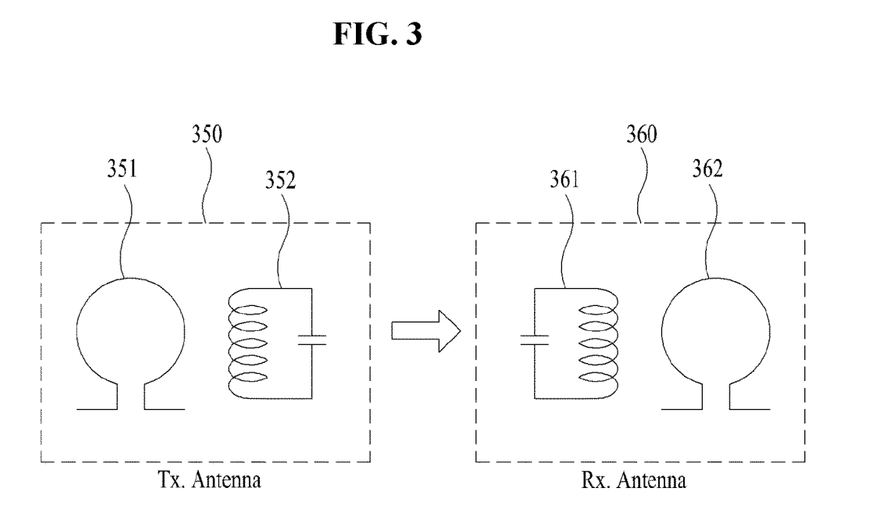
FIG. 3 is a diagram for describing an antenna unit of a wireless power transmitting device, according to an embodiment of the present invention.

FIG. 3 is a diagram for describing an antenna unit of a wireless power transmitting device, according to an embodiment of the present invention.

Referring to FIG. 3, detailed elements of a transmit antenna unit 350 and a receive antenna unit 360 of the wireless power transmitting device may be verified. This is a diagram for describing a configuration of the transmit antenna unit 250 connected with the wireless power transmitting device 210 and a configuration of the receive antenna unit 260 connected with the wireless power receiving device 220 in the wireless power transmitting device of FIG. 2 in detail.

As illustrated in FIG. 3, the wireless power transmitting device may transmit power in the form of a RF signal by using a magnetic resonance method between the transmit antenna unit 350 and the receive antenna unit 360. Furthermore, the wireless power transmitting device may transmit the power by using the magnetic induction method between the transmit antenna unit 350 and the receive antenna unit 360.

To the end, the transmit antenna unit 350 may have a resonant frequency the same as or close to a resonant frequency of the receive antenna unit 360. It is designed such that power is transmitted with optimum efficiency in a resonant state matched between the transmit antenna unit 350 and the receive antenna unit 360.

The transmit antenna unit 350 may include a transmit antenna 351 and a transmit resonance antenna 352. The transmit antenna 351 or the transmit resonance antenna 352 may be implemented in the form of a loop. In addition, the transmit resonance antenna 352 may have a spiral loop form or a helical loop form.

Moreover, the power may be transmitted between the transmit antenna 351 and the transmit resonance antenna 352 in the magnetic induction manner.

Likewise, the receive antenna unit 360 may include a receive antenna 362 and a receive resonance antenna 361 respectively corresponding to the transmit antenna 351 and the transmit resonance antenna 352. Also, the power may be transmitted between the receive antenna 362 and the receive resonance antenna 361 in the magnetic induction manner.

The process of transmitting the power from the transmit antenna unit 350 to the receive antenna unit 360 may be performed as follows. Above all, the power received through the wireless power transmitting device may be excited in the transmit antenna 351 of the transmit antenna unit 350. The power excited in the transmit antenna 351 may be transmitted to the transmit resonance antenna 352 in the magnetic induction manner.

While resonating with each other at the same or close resonance frequency, the transmit resonance antenna 352 and the receive resonance antenna 361 may form an energy transmission channel. The power transmitted to the transmit resonance antenna 352 may be transmitted to the receive resonance antenna 361 through the energy transfer channel, and may be transmitted from the receive resonance antenna 361 to the receive antenna 362 through the magnetic induction manner.

Figure 4:
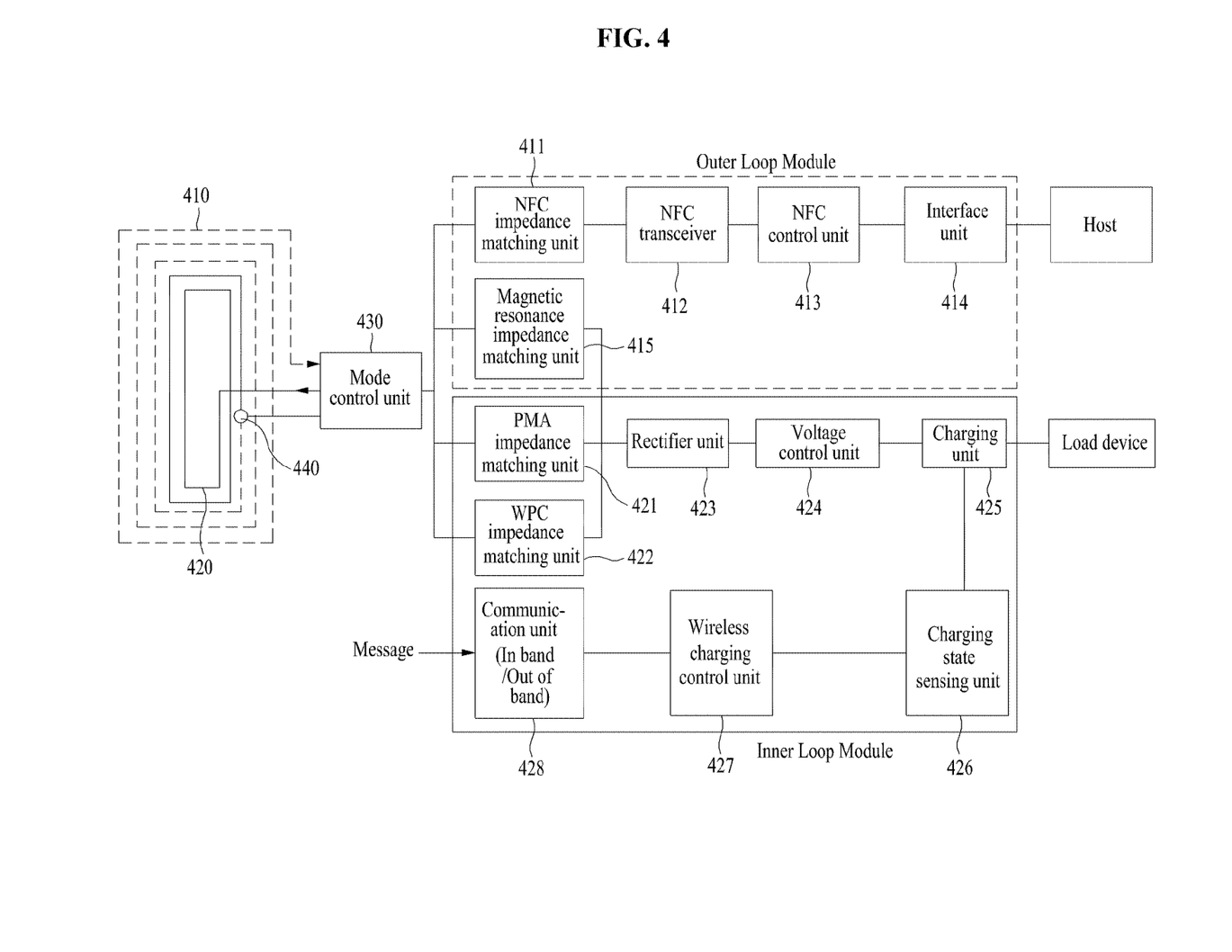
FIG. 4 is a block diagram illustrating a multi-mode wireless power receiving device, according to an embodiment of the present invention.

FIG. 4 is a block diagram illustrating a multi-mode wireless power receiving device, according to an embodiment of the present invention.

Referring to FIG. 4, the multi-mode wireless power receiving device may include an antenna module (an outer loop 410 and inner loop 420), a mode control unit 430, a switch 440, an outer loop module, and an inner loop module.

The antenna module may be implemented with a coil of a dual loop form including the outer loop 410 and the inner loop 420.

The mode control unit 430 may control an operating mode of the antenna module and may select operations of the outer loop 410 and the inner loop 420 of the antenna module by manipulating the switch 440.

The switch 440 may connect the outer loop 410 and the inner loop 420 of the antenna module and may operate while being turned on/off by the mode control unit 430.

The outer loop module may be connected with the antenna module by the mode control unit 430 and may selectively perform a magnetic resonance method and NFC communication by using the outer loop 410 according to an operation of the switch 440.

In other words, in the case where the switch 440 is turned off, the outer loop module may selectively perform the magnetic resonance method and the NFC communication by using the outer loop 410. That is, after the switch 440 is turned off, only the outer loop 410 may operate, and thus the operating mode may become a dual mode supporting the magnetic resonance method and the NFC communication.

In this case, the magnetic resonance method may transmit power according to Alliance for Wireless Power (A4WP). In the case of the A4WP, since an operating frequency is fixed to 6.78 MHz greater than 100-205 KHz or 277-357 KHz being a range of WPC and PMA, it is possible to efficiently transmit the power according to Faraday's law of induction by using a low coupling coefficient (high flexibility in light of the charging location). In addition, since a receive coil becomes smaller and thinner as a frequency and a coil voltage become higher, it is easy to mount a component on a mobile device or the like.

Furthermore, since the level of surface eddy currents is low when the operating frequency is high, heat may be accumulated less in an external metal objects around a transmitter pad. This may mean that the heat is generated less in metal (e.g., a battery or the like) included in a device being charged. In particularly, in an A4WP standard, power demands of the device being charged may be verified and managed by using bidirectional Bluetooth low energy (BLE) out-of-band signaling. Also, the degree of spatial freedom is high, and one transmitter pad may support a plurality of receivers at the same time such that the wireless power is transmitted.

Moreover, the outer loop module may support the NFC communication (13.56 MHz). A NFC module in the outer loop module may include a NFC impedance matching unit 411, a NFC transceiver 412, a NFC control unit 413, and an interface unit 414.

The NFC transceiver 412 may perform the NFC communication so as to communicate with an external host.

The NFC control unit 413 may be connected with the NFC transceiver 412 and may control an operation of the NFC transceiver 412.

The interface unit 414 may be an interface for communicating with the external host.

The NFC impedance matching unit 411 may be placed between the NFC transceiver 412 and the antenna module, and may match impedance between the NFC transceiver 412 and the outer loop of the antenna module.

Here, since the outer loop 410 operates, the antenna module may be used as an NFC antenna. In this case, the NFC antenna may have a dual antenna structure in which an antenna for an NFC reader and an antenna for an NFC tag are stacked. In this case, the NFC antenna may be formed on each of opposite surfaces of a printed circuit board (PCB) or a film.

In a NFC communication mode, the outer loop 410 may be controlled by the outer loop module or the NFC module in the outer loop module. If a NFC function is requested by a user or an operation of an application on a mobile terminal, an application processor (AP) of the mobile terminal may operate the NFC module in the outer loop module. If sensing an operation of the NFC module in the outer loop module, the mode control unit 430 may change an operating mode of the antenna module into an NFC communication mode. Also, while the NFC communication mode is maintained, the outer loop 410 may operate as the NFC antenna.

Moreover, the outer loop 410 may operate in connection with the outer loop module and/or the inner loop module for transmitting the wireless power. If a transmission function of the wireless power is activated on the mobile terminal, the AP of the mobile terminal may operate the outer loop module and/or the inner loop module. If an operation of the outer loop module and/or the inner loop module is sensed, the mode control unit 430 may change the operating mode of the antenna module into a mode for transmitting the wireless power. In this case, the outer loop and/or the inner loop may be used to transmit the wireless power.

Meanwhile, it is designed such that whether the NFC communication module or a module for the wireless power operates is controlled by the mode control unit 430. For example, in the case of the NFC communication mode, the mode control unit 430 may change a state of the switch 440 into an off state and may control the outer loop 410 of the antenna module to operate as an antenna for NFC.

The inner loop module is connected with the antenna module by the mode control unit 430, and then the inner loop module may transmit power in a magnetic induction method by using the outer loop 410 and the inner loop 420 at the same time according to an operation of the switch 440.

In other words, in the case where the switch 440 is turned on, the inner loop module may selectively operate the PMA and the WPC of the magnetic induction method by using the outer loop 410 and the inner loop 420 at the same time to transmit the power. That is, after the switch 440 is turned on, both the outer loop 410 and the inner loop 420 may operate, and thus the operating mode of the inner loop module may become a dual mode in which the WPC and the PMA being the magnetic induction method are supported.

Here, the PMA and the WPC of the magnetic induction method are excellent in power transmission efficiency because magnetic coupling is strong, and a design thereof is easy. Furthermore, battery efficiency thereof is high.

The inner loop module may include impedance matching units 421 and 422, a rectifier unit 423, a voltage control unit 424, and a charging unit 425.

The rectifier unit 423 may rectify a RF signal received through the antenna module into DC power by rectifying the RF signal in a half-wave rectification form. That is, the rectifier unit 423 may rectify the wireless power received in a wireless power receiving device into power of a DC type.

The voltage control unit 424 may change the DC signal rectified by the rectifier unit 423 into a voltage that is capable of being used for a load device. Formerly, filtering for removing a high-frequency noise component from the DC signal rectified by the rectifier unit 423 may be performed.

The impedance matching unit is placed between the antenna module and the rectifier unit 423 and may match impedance between the antenna module and the rectifier unit 423. For example, the impedance matching unit may allow output power to be high efficiency or high output, by adjusting the impedance viewed from the impedance matching unit. The impedance matching unit may adjust the impedance based on the control of the mode control unit 430 and a communication unit 428.

Here, the impedance matching unit may include at least one or more of a PMA impedance matching unit 421 and a WPC impedance matching unit 422 using the magnetic induction method.

In addition, the outer loop module may further include a magnetic resonance impedance matching unit 415 using the magnetic resonance method. Like the impedance matching unit, in the case where the magnetic resonance impedance matching unit 415 is selected, the rectifier unit 423 of the inner loop module may rectify a RF signal that is input through the antenna module, and the voltage control unit 424 may change the rectified DC signal into a voltage capable of being used for the load device. Accordingly, the inner loop module may transmit the power to the load device.

Furthermore, the inner loop module may further include the charging unit 425 that charges the external load device by using the power being output.

Also, the inner loop module may further include a charging state sensing unit 426, a wireless charging control unit 427, and the communication unit 428.

The charging state sensing unit 426 may sense an operation of the charging unit 425. Moreover, the charging state sensing unit 426 may allow a charging state of the external load device to be sensed.

The wireless charging control unit 427 may control charging by using charging state information received from the charging state sensing unit 426.

The communication unit 428 may receive a control message from the outside and may transmit the control message to the wireless charging control unit 427.

In addition, the communication unit 428 may select at least one of in-band and out-of-band. In the case where the in-band is selected in the communication unit 428, the switch 440 may be turned on, and then at least one or more of the PMA impedance matching unit 421 and the WPC impedance matching unit 422 may be selected by the mode control unit 430. As such, the WPC (100 to 205 kHz) and the PMA (277 to 357 kHz) of the magnetic induction method of the inner loop module may be supported.

Furthermore, in the case where the out-of-band is selected in the communication unit 428, the switch 440 may be turned off, and the magnetic resonance impedance matching unit 415 may be selected by the mode control unit 430. As such, the A4WP (6.78 MHz) or the like of the magnetic resonance method of the outer loop module may be supported. In the A4WP standard, power demands of the device being charged may be verified and managed by using bidirectional BLE out-of-band signaling. That is, the A4WP may allow average power to be irradiated at a frequency that is not greater than or is not less than necessary bandwidth limit.

Accordingly, each of the outer loop module and the inner loop module may have a dual resonant frequency, and the antenna module of a dual loop form may be divided into the outer loop (magnetic resonance/NFC) and the inner loop (WPC/PMA of magnetic induction) by manipulating the switch 440.

In other words, in the case where the switch 440 between the inner loop and the outer loop is turned off, the magnetic resonance and the NFC function of a MHz band may be performed by using only the outer loop. In the case where the switch 440 between the inner loop and the outer loop is turned on, resonance length may become longer. In this case, both the WPC and the PMA of a kHz band may be supported by using both the outer loop and the inner loop.

Figure 5:
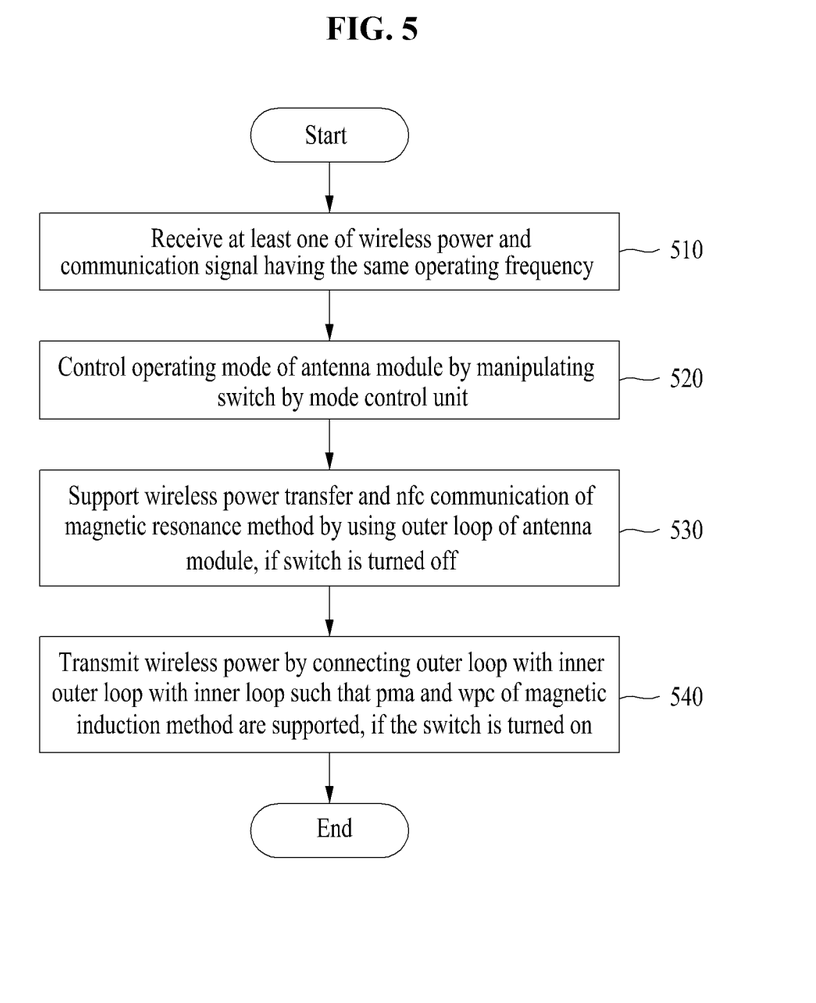
FIG. 5 is a flowchart illustrating a multi-mode wireless power receiving method, according to an embodiment of the present invention.

FIG. 5 is a flowchart illustrating a multi-mode wireless power receiving method, according to an embodiment of the present invention.

Referring to FIG. 5, the multi-mode wireless power receiving method will be described in detail by using the multi-mode wireless power receiving device described in FIGS. 1 to 4. Since an operation associated with each of elements is described above, a detailed description thereof is thus omitted.

In operation 510, at least one of wireless power and a communication signal, each of which has the same operating frequency may be received from a wireless power transmitting device.

In operation 520, an operating mode of an antenna module may be controlled by manipulating a switch by a mode control unit.

In operation 530, in the case where the switch is turned off, wireless power transfer and NFC communication of a magnetic resonance method may be supported by using an outer loop of the antenna module.

In the case where a magnetic resonance impedance matching unit is selected, a method for supporting the wireless power transfer and the NFC communication of the magnetic resonance method by using the outer loop of the antenna module may rectify a RF signal input through the antenna module, may change the rectified DC signal into a voltage capable of being used for a load device, and may transmit wireless power.

Furthermore, a method for supporting the wireless power transfer and the NFC communication of the magnetic resonance method by using the outer loop of the antenna module may match impedance between a NFC transceiver and the outer loop of the antenna module and may perform the NFC communication through an interface such that the NFC transceiver communicates with an external host.

In operation 540, in the case where the switch is turned on, the outer loop and the inner loop are connected with each other, and thus the wireless power may be transmitted to the wireless power receiving device by supporting PMA and WPC of a magnetic induction method.

The method for transmitting wireless power to a wireless power receiving device by supporting the PMA and the WPC of the magnetic induction method may match the impedance between the antenna module and the rectifier unit by at least one or more of a PMA impedance matching unit and a WPC impedance matching unit that employ the magnetic induction method, may rectify a RF signal input through the antenna module, may change the rectified DC signal into a voltage capable of being used for a load device, and may transmit wireless power.

In addition, a communication unit may select at least one of in-band and out-of-band. At this time, in the case where the in-band is selected, a switch may be turned on, and at least one or more of the PMA impedance matching unit and the WPC impedance matching unit may be selected by a mode control unit. Accordingly, the wireless power may be transmitted. In addition, in the case where the out-of-band is selected, the switch may be turned off, and a magnetic resonance impedance matching unit may be selected by the mode control unit. Accordingly, the wireless power may be transmitted.

Above, according to an embodiment of the present invention, magnetic induction, magnetic resonance, and NFC may be supported by using one resonance coil, and thus, a multi-mode wireless power receiving device and method capable of being wirelessly charged in a multi-mode may be provided.

Furthermore, an antenna module of a dual loop type may include an outer loop and an inner loop, each of which has a dual resonant frequency, and thus a multi-mode wireless power receiving device and a method thereof that operate in the outer loop (magnetic resonance/NFC) mode and the inner loop (WPC/PMA of magnetic induction) mode through manipulation of the switch may be provided.

While a few exemplary embodiments have been shown and described with reference to the accompanying drawings, it will be apparent to those skilled in the art that various modifications and variations can be made from the foregoing descriptions. For example, adequate effects may be achieved even if the foregoing processes and methods are carried out in different order than described above, and/or the aforementioned elements, such as systems, structures, devices, or circuits, are combined or coupled in different forms and modes than as described above or be substituted or switched with other components or equivalents.

Therefore, other implements, other embodiments, and equivalents to claims are within the scope of the following claims.

The invention claimed is:

1. A multi-mode wireless power receiving device comprising:
    an antenna module including an outer loop and an inner loop;
    a mode control unit configured to control an operating mode of the antenna module;
    a switch connecting the outer loop and the inner loop and operated by the mode control unit;
    an outer loop module configured to support a magnetic resonance method and near field communication (NFC) communication by using the outer loop, according to an operation of the switch; and
    an inner loop module configured to support a magnetic induction method by using the outer loop and the inner loop simultaneously according to the operation of the switch and to transmit power.

2. The multi-mode wireless power receiving device of claim 1, wherein the outer loop module selectively performs the magnetic resonance method and the NFC communication by using the outer loop if the switch is turned off.

3. The multi-mode wireless power receiving device of claim 1, wherein the inner loop module selectively performs Power Matters Alliance (PMA) and Wireless Power Consortium (WPC) of the magnetic induction method by using the outer loop and the inner loop simultaneously to transmit the power, if the switch is turned on.

4. The multi-mode wireless power receiving device of claim 1, wherein each of the outer loop module and the inner loop module has a dual operating frequency.

5. The multi-mode wireless power receiving device of claim 1, wherein the inner loop module includes:
    a rectifier unit configured to rectify a radio frequency (RF) signal input through the antenna module;
    a voltage control unit configured to change a direct current (DC) signal rectified by the rectifier unit into a voltage capable of being used for a load device; and
    an impedance matching unit placed between the antenna module and the rectifier unit and configured to match impedance between the antenna module and the rectifier unit.

6. The multi-mode wireless power receiving device of claim 5, wherein the impedance matching unit includes:
    a PMA impedance matching unit and a WPC impedance matching unit that use the magnetic induction method.

7. The multi-mode wireless power receiving device of claim 5, wherein the outer loop module further includes:
    a magnetic resonance impedance matching unit using the magnetic resonance method, and
    wherein if the magnetic resonance impedance matching unit is selected, the rectifier unit of the inner loop module rectifies the RF signal input through the antenna module, the voltage control unit changes the rectified DC signal into the voltage capable of being used for the load device, and the inner loop module transmits the power.

8. The multi-mode wireless power receiving device of claim 5, wherein the inner loop module further includes:
    a charging unit configured to charge the load device by using the power being output.

9. The multi-mode wireless power receiving device of claim 1, wherein the outer loop module further includes:
    an NFC transceiver configured to perform the NFC communication to communicate with an external host;
    an NFC control unit connected with the NFC transceiver and configured to control an operation;
    an interface unit configured to communicate with the external host; and
    an NFC impedance matching unit placed between the NFC transceiver and the antenna module and configured to match impedance between the NFC transceiver and the outer loop of the antenna module.

10. The multi-mode wireless power receiving device of claim 1, wherein the inner loop module further includes:
    a charging state sensing unit configured to sense an operation of a charging unit;
    a wireless charging control unit configured to control charging by using charging state information received from the charging state sensing unit; and
    a communication unit configured to receive a control message from an outside and to transmit the control message to the wireless charging control unit.

11. The multi-mode wireless power receiving device of claim 10, wherein the communication unit selects at least one of in-band and out-of-band,
    wherein if the in-band is selected, the switch is turned on, and at least one or more of a PMA impedance matching unit and a WPC impedance matching unit is selected by the mode control unit, and
    wherein if the out-of-band is selected, the switch is turned off, and a magnetic resonance impedance matching unit is selected by the mode control unit.

12. A multi-mode wireless power receiving method, the method comprising:
    receiving at least one of wireless power and a communication signal, which have the same operating frequency, from a wireless power transmitting device;
    controlling an operating mode of an antenna module by manipulating, at a mode control unit, a switch;
    supporting transmission of the wireless power and NFC communication of a magnetic resonance method by using an outer loop of the antenna module, if the switch is turned off; and
    transmitting the wireless power to a wireless power receiving device by connecting the outer loop and an inner loop such that PMA and WPC of a magnetic induction method are supported, if the switch is turned on.

13. The method of claim 12, wherein the transmitting of the wireless power to the wireless power receiving device by connecting the outer loop and the inner loop and by supporting PMA and WPC of the magnetic induction method includes:

matching, by at least one or more of a PMA impedance matching unit and a WPC impedance matching unit that use the magnetic induction method, impedance between the antenna module and a rectifier unit;

rectifying a RF signal input through the antenna module; and changing a rectified DC signal into a voltage capable of being used for a load device to transmit the wireless power.

14. The method of claim 12, further comprising:

selecting, by a communication unit, at least one of in-band and out-of-band;

if the in-band is selected, transmitting the wireless power by turning on the switch such that the mode control unit selects at least one or more of a PMA impedance matching unit and a WPC impedance matching unit; and if the out-of-band is selected, transmitting the wireless power by turning off the switch such that the mode control unit selects a magnetic resonance impedance matching unit.

15. The method of claim 12, wherein the supporting of the transmission of the wireless power and the NFC communication of the magnetic resonance method by using the outer loop of the antenna module includes:

if a magnetic resonance impedance matching unit is selected, rectifying a RF signal input through the antenna module;

changing a rectified DC signal into a voltage capable of being used for a load device; and transmitting the wireless power.

16. The method of claim 12, wherein the supporting of the transmission of the wireless power and the NFC communication of the magnetic resonance method by using the outer loop of the antenna module includes:

matching impedance between a NFC transceiver and the outer loop of the antenna module; and performing the NFC communication through an interface such that the NFC transceiver communicates with an external host.

* * * * *